(12) United States Patent
Wei (10) Patent No.: US 11,425,498 B2
(45) Date of Patent: Aug. 23, 2022

(54) SPEAKER AMPLIFIER

(71) Applicant: TEXAS INSTRUMENTS INCORPORATED, Dallas, TX (US)

(72) Inventor: Ding Wei, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/990,488

(22) Filed: Aug. 11, 2020

(65) Prior Publication Data

US 2021/0289295 A1   Sep. 16, 2021

Related U.S. Application Data

(63) Continuation of application No. PCT/CN2020/079260, filed on Mar. 31, 2020.

(30) Foreign Application Priority Data

Mar. 31, 2020 (WO) ................ PCT/CN2020/079260

(51) Int. Cl.
| | |
|---|---|
| H04R 3/00 | (2006.01) |
| H04R 1/22 | (2006.01) |
| H04R 29/00 | (2006.01) |
| H03F 3/217 | (2006.01) |
| H03G 1/00 | (2006.01) |

(52) U.S. Cl.
CPC ............ *H04R 3/007* (2013.01); *H03F 3/217* (2013.01); *H03G 1/0005* (2013.01); *H04R 1/22* (2013.01); *H04R 29/003* (2013.01); *H03F 2200/03* (2013.01)

(58) Field of Classification Search
CPC ........ H04R 3/007; H04R 29/003; H04R 1/22; H03F 3/217; H03F 2200/03; H03G 1/0005
USPC ....................................... 381/55, 58, 59, 120
See application file for complete search history.

(56) References Cited

U.S. PATENT DOCUMENTS

| | | | | |
|---|---|---|---|---|
| 5,847,610 | A * | 12/1998 | Fujita ................... | H03F 1/52 330/298 |
| 8,817,995 | B2 * | 8/2014 | Huijser ................. | H04R 3/007 381/59 |

(Continued)

FOREIGN PATENT DOCUMENTS

| | | |
|---|---|---|
| CN | 104038882 | 9/2014 |
| CN | 107222812 | 9/2017 |
| WO | 2010135294 | 11/2010 |

OTHER PUBLICATIONS

International Search Report in corresponding PCT Patent Application No. PCT/CN2020/079260, dated Dec. 14, 2020 (4 pages).

*Primary Examiner* — David L Ton
(74) *Attorney, Agent, or Firm* — John R. Pessetto; Charles A. Brill; Frank D. Cimino (57) ABSTRACT

A method of regulating power supply to a speaker and a system for regulating power supply to a speaker comprising a generating of a low frequency signal output to the speaker, sensing a current and a voltage of the speaker after the low frequency signal is output to the speaker, measuring an impedance of the speaker based on the current and voltage, determining a temperature of the speaker and comparing with a threshold value, and lowering a power supply to the speaker where the temperature is above the threshold value.

23 Claims, 4 Drawing Sheets

(56) References Cited

U.S. PATENT DOCUMENTS

| | | | |
|---|---|---|---|
| 8,983,080 B2* | 3/2015 | Luo | H04R 3/007 |
| | | | 381/55 |
| 8,995,673 B2* | 3/2015 | Mihelich | H04R 3/007 |
| | | | 381/59 |
| 2007/0098190 A1 | 5/2007 | Song et al. | |
| 2013/0077796 A1 | 3/2013 | Risbo et al. | |
| 2014/0169571 A1* | 6/2014 | Polleros | H04R 9/06 |
| | | | 381/55 |
| 2015/0078558 A1* | 3/2015 | Thandri | H04R 1/1041 |
| | | | 381/59 |
| 2015/0078559 A1* | 3/2015 | Ilango | G10K 11/17854 |
| | | | 381/59 |
| 2015/0215704 A1* | 7/2015 | Magrath | H04R 9/022 |
| | | | 381/55 |
| 2015/0230018 A1* | 8/2015 | Wen | H04R 3/007 |
| | | | 381/59 |
| 2016/0182998 A1* | 6/2016 | Galal | H03F 3/185 |
| | | | 381/55 |
| 2021/0075384 A1* | 3/2021 | Cheng | H03F 3/45475 |

\* cited by examiner

FIG. 4

SPEAKER AMPLIFIER

BACKGROUND

A speaker turns electrical currents into physical vibrations to generate sound waves. When electrical current runs through a coil of a speaker, a magnetic field is created. The magnetic field generated by the coil interacts with other magnetic fields of the speaker, which in turn moves the coil to vibrate air and generate the sound waves.

Where a speaker is incorporated into devices with area constraints, the size of the coil is also limited by the area constraints. The smaller the size of the coil, the smaller the current or voltage it can withstand during operation. Too much current or voltage may lead to excessive heat or movement of the coil, which can damage the coil.

To safely operate the speaker without damaging the coil, methods and systems are implemented to measure the current of and/or voltage over the coil. Smart amplifiers that supply power to the speaker include analog digital converters to sense the coil's current of and/or voltage. The sensed current and/or voltage is then fed back to a processor which controls a device that includes the speaker. The processor regulates the current and/or voltage supplied to the speaker based on the feedback current and/or voltage.

At least because of the cost of the analog digital converters, however, a smart amplifier may not be the most cost-effective solution for a device to safeguard a speaker against thermal or mechanical damages.

SUMMARY

According to one example, a method of regulating power supplied to a speaker comprises outputting a signal with low frequency to the speaker, measuring a current of and a voltage over the speaker based on the low frequency signal, determining an impedance of the speaker based on the measured current and voltage, and regulating a power supply to the speaker based on the impedance, According to another example, a speaker power regulating system comprises an application processor configured to generate an impedance measuring signal and output to a speaker, a current and voltage sensor respectively configured to measure a current and a voltage of the speaker based on the impedance measuring signal, and a speaker impedance measuring module configured to determine a value indicative of an impedance of the speaker based on the measured current and voltage, and the application processor further configured to regulate the power supplied to the speaker based on the value indicative of impedance from the speaker impedance measuring module.

BRIEF DESCRIPTION OF THE DRAWINGS

For a detailed description of various examples, reference will now be made to the accompanying drawings in which.

DETAILED DESCRIPTION

Figure 1:
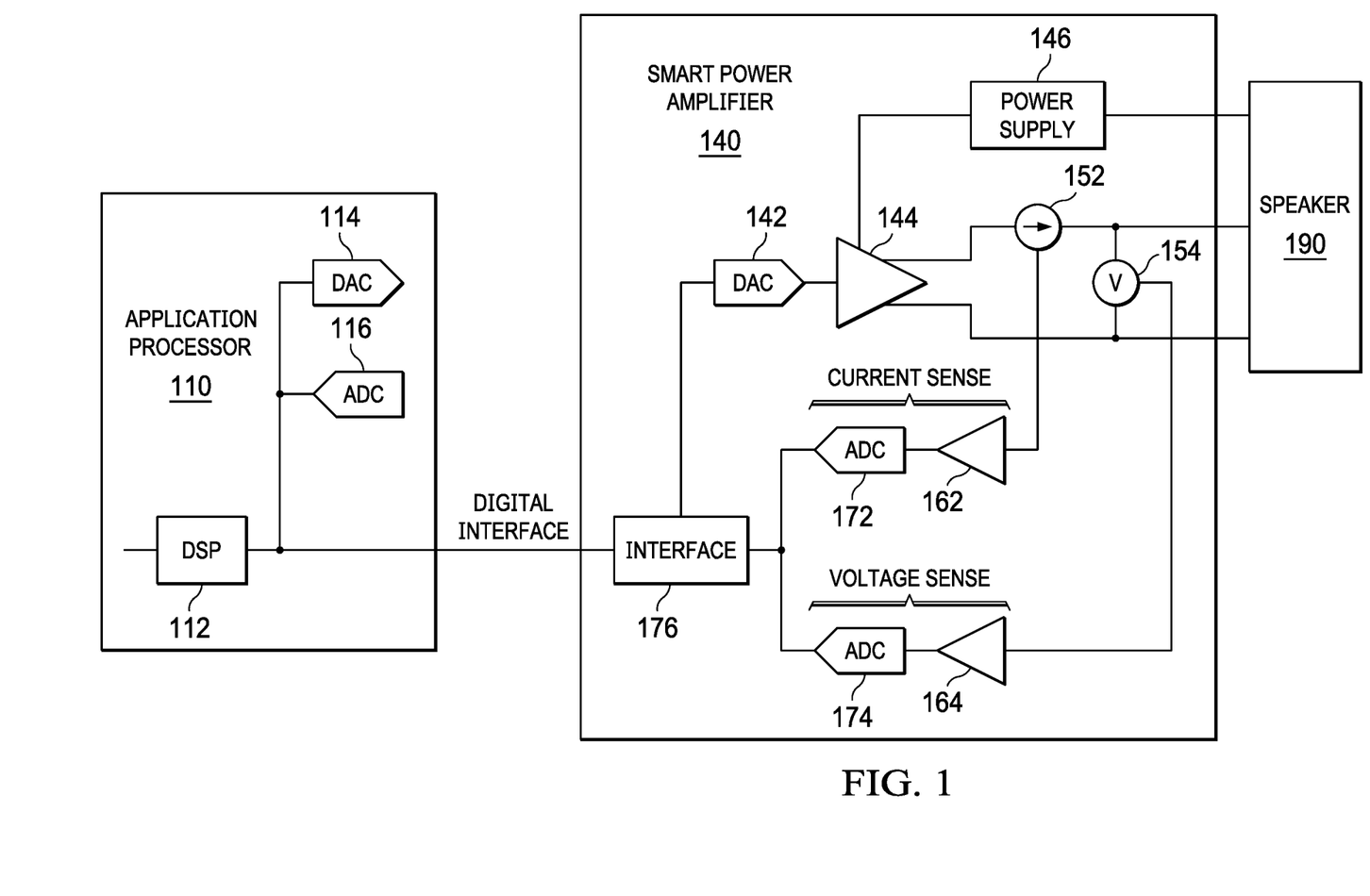
FIG. 1 includes an example of a system of providing power to a speaker.

FIG. 1 illustrates an example of a system of supplying power to a speaker. In the example system of FIG. 1, application processor 110 is coupled to smart power amplifier 140, which is configured to provide power to speaker 190. Speaker 190 may be a speaker integrated into a smaller device, such as a smart phone or other type of communication device. Smart power amplifier 140 is configured to measure the temperature constraints of speaker 190 and communicate with application processor 110 to protect speaker 190 from excessive voltage and/or current. The regulation of power supplied to speaker 190 prevents thermal and/or mechanical damage to speaker 190.

Smart power amplifier 140 of FIG. 1 comprises a digital-to-analog converter (DAC) 142 which is configured to convert a digital signal from application processor 110 to its analog form. The digital signal from application processor 110 is provided to interface 176 of smart power amplifier 140. The interface 176 of the smart amplifier 140 may be implemented as a serial bus such as the Inter-IC Sound (I2S) interface. The analog signal output from digital analog converter 142 is provided to amplifier 144, which amplifies the analog signal provided to power supply 146. Based on the signal provided by amplifier 144, power supply 146 supplies corresponding power to speaker 190.

Amplifier 144 amplifies signals from application processor 110 (via DAC 142) to speaker 190. A current sensor 152 (e.g., a low value resistance such as 1 ohm) and a voltage sensor 154 (e.g., a high input impedance buffer) are provided to measure the current to and the voltage across the speaker's coil. Current sensed by current sensor 152 is amplified via amplifier 162 and converted into a digital signal form via analog-to-digital converter (ADC) 172. Voltage sensed by voltage sensor 154 is amplified via amplifier 164 and converted into a digital signal form via ADC 174. ADCs 172 and 174, respectively, output the current measured by current sensor 152 and voltage measured by voltage sensor 154 to interface 176, which in turn transmits the a digital value indicative of the measured current and voltage values to application processor 110.

Application processor 110 comprises a digital signal processor 112 configured to regulate a power output of power supply 146 based on the measured current and voltage of the speaker 190. Application processor 110 further comprises a DAC 114 and an ADC 116 to communicate with smart power amplifier 140 or other components of a device controlled by application processor 110.

In the example system of FIG. 1, smart power amplifier 140 comprises DAC 142, as well as ADCs 172, 174. The architecture of FIG. 1 including such DAC and ADCs drives up the cost of the smart power amplifier 140 and prohibits devices with limited budgets from adopting an amplifier similar to smart power amplifier 140.

According to another example system, a power supply to a speaker is regulated based on a current to, and voltage across, the speaker. In this example, an impedance of the speaker is measured based on the current and voltage of the speaker's coil. An application processor of a device incorporating the speaker communicates with the power supply using an analog signal. The current and voltage of the speaker is sensed. An impedance of the speaker is then measured based on the sensed current and voltage, and the impedance value is communicated to the application processor in an analog signal form. Based on the impedance value, the application processor determines the temperature of the speaker and, in the event the speaker temperature is estimated to be in excess of a preset threshold, lowers the supply voltage to the speaker to thereby cause the speaker's temperature to decrease.

Figure 2:
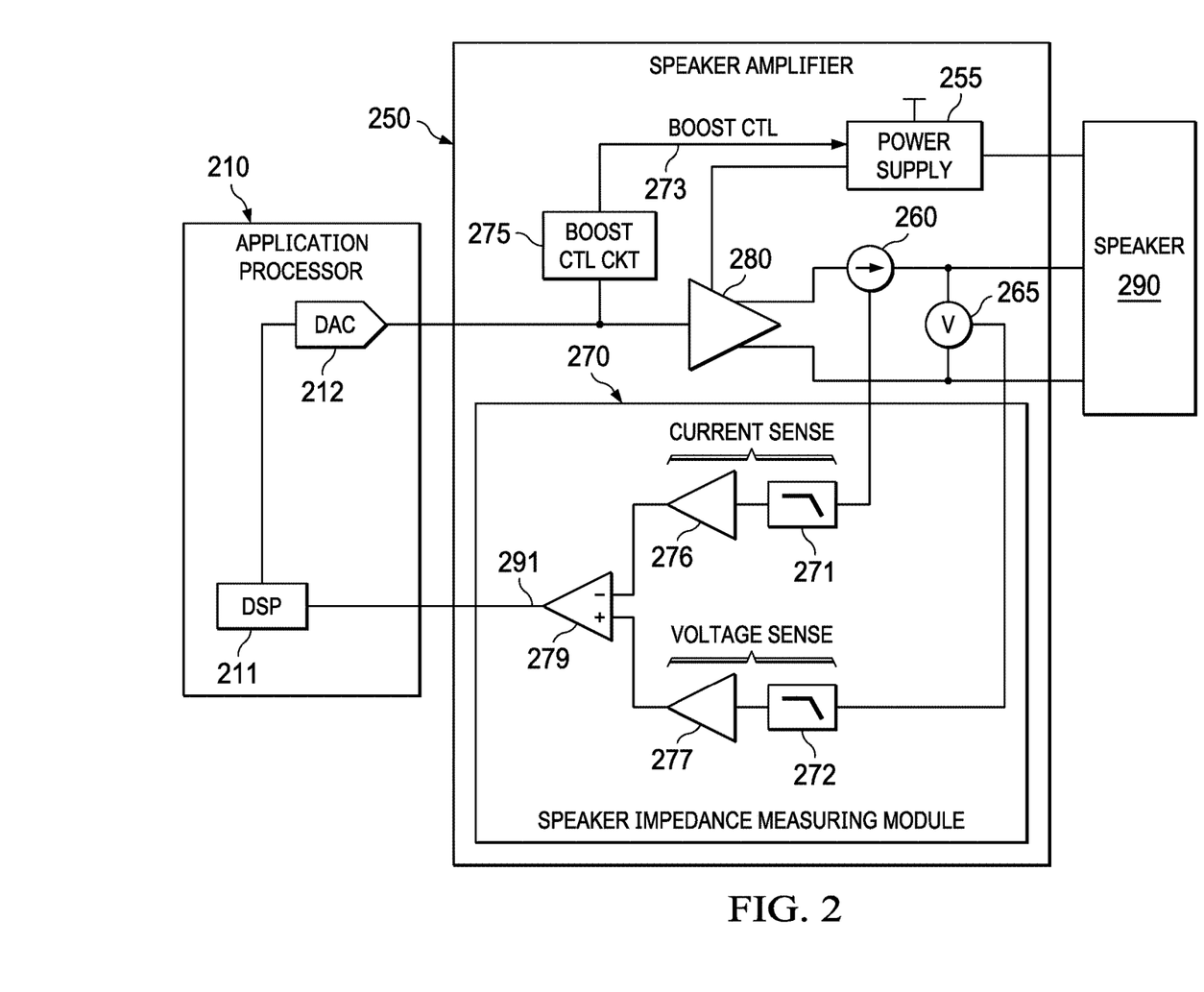
FIG. 2 includes another example of a system of providing power to a speaker.

FIG. 2 illustrates an example of a speaker power regulating system. The system of FIG. 2 comprises an application processor 210 coupled to a speaker amplifier 250. Speaker amplifier 250 is shown coupled to speaker 290 and supplies power to speaker 290 based on audio-signals from application processor 210. In FIG. 2, application processor 210 and speaker amplifier 250 communicates in an analog signal form, that is, without the use of a digital interface such as interface 176 in FIG. 1). This reduces the cost of speaker amplifier 250 as there is no need to include analog digital converter or digital analog converter within speaker amplifier 250.

Application processor 210 comprises digital signal processor 211 and DAC 212. DAC 212 is configured to convert digital audio signals (i.e., a digital signal that encodes audio) from digital signal processor 211 into analog audio signals to thereby be provided to speaker 290. To determine the impedance of the speaker's coil, the digital signal processor 211 is configured to generate a signal of a frequency lower than a frequency of an audio signal, that is, a frequency that is not audible to human ears. This low frequency signal is provided to the speaker, and the resulting speaker's current and voltage are measured and used to determine impedance (e.g., impedance is the ratio of voltage to current). Because the low frequency signal does not interfere with the normal audio signals intended for human hearing, the impedance measurement may be made continually (e.g., once per second). The low frequency signal generated by digital signal processor 211 for impedance measurements is converted into an analog signal by DAC 212 and provided to speaker amplifier 250.

Speaker amplifier 250 comprises amplifier 280 which amplifies signals from application processor 210 and outputs the amplified signals to speaker amplifier 250. Speaker amplifier 250 further comprises a boost control circuit 275, power supply 255, current sensor 260, voltage sensor 265, and speaker impedance measuring module 270. The power supply 255 supplies power to speaker 290 based on audio signals from application processor 210. The power supply 155 receives an input supply voltage and generates supply voltages to amplifier 280 and speaker 290, and other active components within the amplifier 250. The voltage generated by the power supply 255 to the speaker may be approximately the supply voltage to the power supply (e.g., the voltage of a cell phone's battery) or it may be a voltage that is boosted up from the power supply's input supply voltage. For example, for low amplitude audio signals from DAC 212, the boost capability of the power supply 255 may be bypassed, but for audio signals over a threshold, the boot capability of the power supply 255 may be invoked to boost the supply voltage to the speaker. Boost control circuit 275 is included in this example to compare the amplitude of the audio signal from the DAC 212 to a threshold to thereby generate a boost control signal 273 to the power supply 255. The logic level of the boost control signal 273 dictates whether the boost capability of the power supply 255 is bypassed or not. If the DSP 211 determines that the speaker is becoming too hot, the DSP 211 will respond by attenuating the audio signal to the DAC 212. The boost control circuit 275 monitors the audio analog output signal from the DAC 212. Responsive to the DAC's audio analog signal being attenuated (due to an over temperature condition), the boost control circuit 275 will cause, via boost control signal 273, the power supply 255 to bypass its boost capability to thereby provide a lower supply voltage to the speaker 290.

Current sensor 260 senses current to speaker 290. Voltage sensor 265 senses the voltage across speaker 290. The speaker impedance measuring module 270 measures an impedance of speaker 290 based on the sensed current and voltage.

As a low frequency signal for speaker impedance measurements, that is, a signal with a frequency less than a frequency of an audio signal (e.g., a signal with a frequency less than 30 Hz), is output to speaker amplifier 250, speaker impedance measuring module 270 measures the impedance of speaker 290 based on the lower frequency signal. In the example of FIG. 2, speaker impedance measuring module 270 comprises low pass filters 271, 272, each respectively coupled to current sensor 260 and voltage sensor 265, and comparator 279. Low pass filter 271 filters out signals from current sensor 260 so that only a current value based on the low frequency signal is filtered to comparator 279. Similarly, low pass filter 272 filters out signals from voltage sensor 265 so that only a voltage value based on the low frequency signal is filtered to comparator 279. Low pass filters 271 and 272 have cutoff frequencies less than, for example, 60 Hz. Speaker impedance measuring module 270 comprises amplifiers 276 and 277, respectively coupled to low pass filter 271 and 272 to amply the filtered signals.

The input signal to the negative input of comparator 279 is a voltage indicative of speaker coil current. The input signal to the positive input of comparator 279 is a voltage indicative of speaker coil voltage. The ratio of voltage to current is impedance. The output signal from comparator is a logic low when the temperature is within an acceptable (predetermined) range, in which case the voltage on the positive input of comparator will be greater than the voltage on the negative input of the comparator. As the speaker coil temperature increases, the impedance of the speaker decreases meaning that coil voltage decreases while coil current increases. When the impedance reaches a threshold point (potential for damage to the speaker), the voltage (indicative of coil voltage) on the comparator's positive input will be below the voltage (indicative of coil current) comparator's negative input, and the comparator's output will flip state (e.g., will change from low to high). Comparator 279 thus provides a signal 291 indicative of the impedance of speaker 290 becoming too high. As signal 291 already is a binary signal (e.g., 0 indicating the speaker temperature is not above a threshold and high indicating the speaker temperature is above the threshold, signal 291 can be provided to the DSP 211 as an interrupt signal without the use of an ADC. In another example, a processor core other than the DSP 211 has an interrupt input coupled to the comparator's output and then communicates with DSP 211 that the speaker has become too hot. In response to signal 291 indicating an excessive temperature within the speaker 290, the DSP 211 will attenuate the audio signal and the boost control circuit 275 responds by causing the power supply 255 to provide a lower supply voltage to the speaker (that is, not a supply voltage that is boosted up from the supply voltage to the power supply). By powering the speaker with a lower supply voltage, the temperature of the speaker will decrease.

Figure 3:
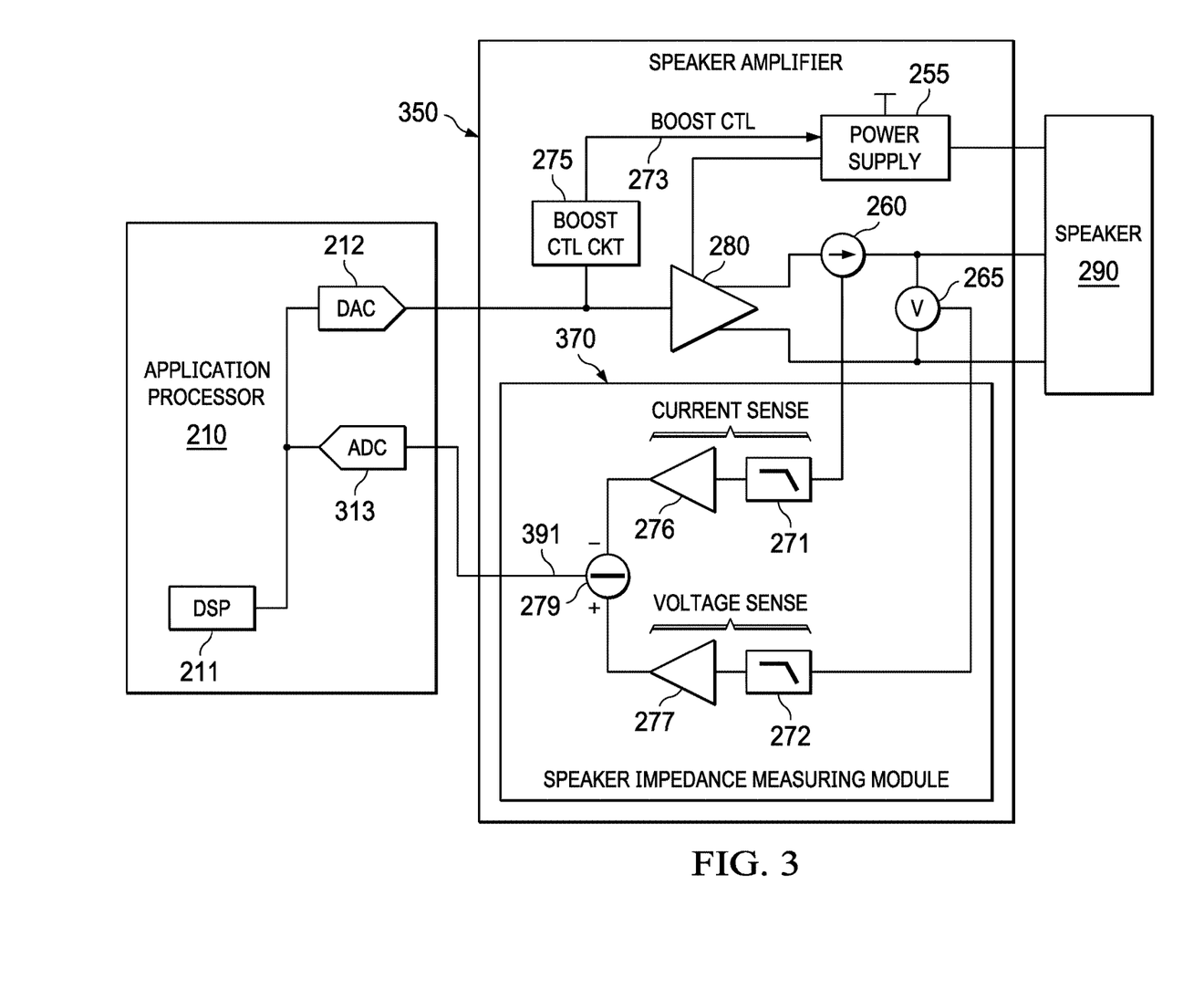
FIG. 3 shows yet another example of a system of providing power to a speaker.

FIG. 3 is another example similar to that of FIG. 2 but includes a speaker amplifier 350 that includes a speaker impedance measuring module 370 in FIG. 3 includes a subtractor 379 (or adder) instead of comparator 279. By determining the analog voltage difference (also called a "subtraction signal") between the voltages indicative of speaker coil current and speaker coil voltage, a signal 391 is indicative of the actual impedance value of the speaker, and thus the speaker's temperature, and not just an indication of whether the temperature is above or below a threshold (as was the case for FIG. 2). The application processor 210 in FIG. 3 also includes an ADC 313 to convert analog signal 391 from the speaker impedance measuring module 370 to a digital value to provide to DSP 211.

As explained above, the impedance of speaker 290 is inversely related to its temperature. That is, as impedance decreases, impedance increases, and vice versa. Excessive temperature can cause damage to the speaker In the example of FIG. 2, digital signal processor 211 causes the supply voltage from power supply 255 to speaker to decrease upon signal 291 changing state to indicate an over-temperature condition. In the example of FIG. 3, the digital signal processor 211 receives a digital signal from ADC 313 indicative of speaker impedance and internally compares that digital signal to a threshold to determine when to throttle down the power supply's output voltage. As explained above, when the temperature of speaker 290 is higher than threshold value, the digital signal processor 211 attenuates the audio signal, which via boost control circuit 275, causes the voltage output of the power supply 255 to be reduced. When the temperature of speaker 290 is lower than threshold value, the digital signal processor 211 does not attenuate the audio signal and the power supply provides the higher (boost) voltage to the speaker 290.

The examples of FIGS. 1-3 may be implemented on an integrated circuit (IC), except the speaker which would be separate from the IC. In one example, the speaker amplifier 250, 350 may be provided on an IC separate from the application processor 210.

Figure 4:
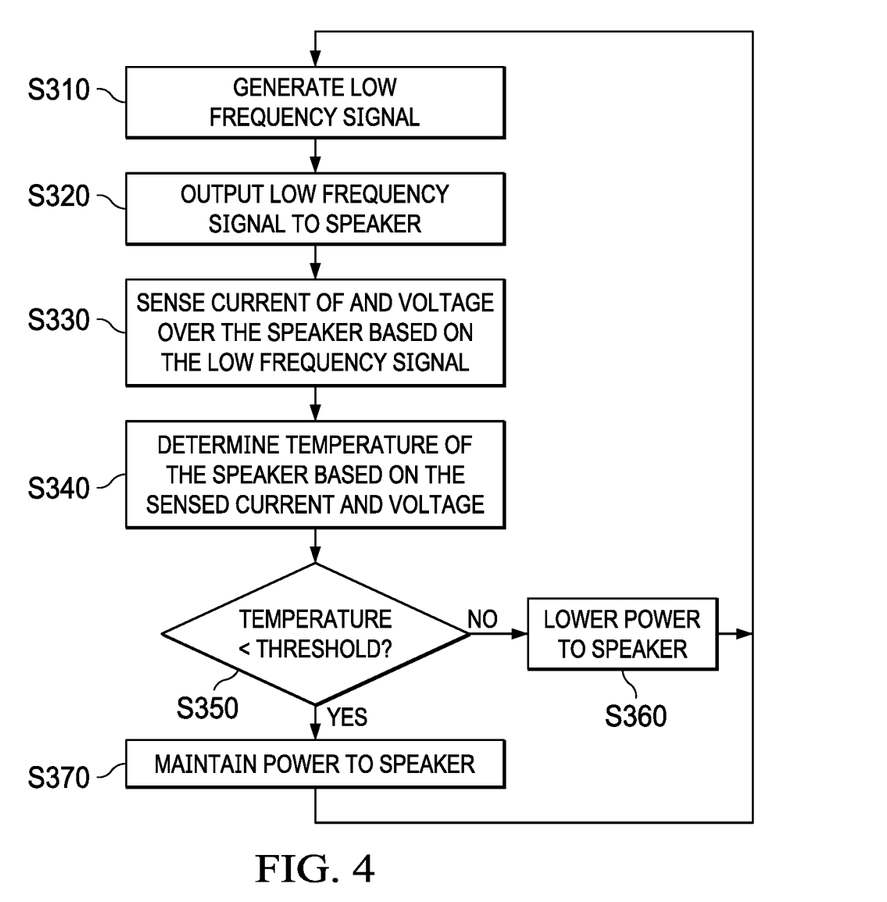
FIG. 4 illustrates an example method of providing power to a speaker.

FIG. 4 illustrates a flow chart showing a method of regulating a power supply voltage to a speaker. In step S310, a low frequency signal, for example, a signal with a frequency lower than the audible perception capability of humans, is generated. In step S320, the low frequency signal is output to a speaker, for example, via amplifier 280 to speaker 290. Subsequently, at S330 the current and voltage of the speaker are sensed based on the low frequency signal to the speaker. In step S340, the method includes determining a temperature of (or a value indicative of whether the impedance/temperature exceeds a threshold) the speaker based on the impedance of the speaker. The impedance of the speaker can be measured based on the current and voltage sensed in step S330. As explained above, the comparator output value is generated to provide an indication of whether the impedance/temperature is above or below a threshold level.

In step 350, whether the temperature of the speaker is below a preset threshold value is determined. When the temperature of the speaker is not below the threshold value, in step S360, power (e.g., supply voltage) to the speaker is lowered. When the temperature of the speaker is determined to be below the threshold value, however, in step S370, power provided to the speaker is maintained.

Modifications are possible in the described embodiments, and other embodiments are possible, within the scope of the claims.

What is claimed is:

1. A method of supplying power to a speaker comprising,
    generating a signal with a frequency lower than a frequency of an audio signal,
    providing the lower frequency signal to a speaker;
    measuring current through and voltage across the speaker based on the lower frequency signal;
    determining an impedance of the speaker based on the measured current and voltage; and
    regulating power supplied to the speaker based on the impedance.

2. The method of claim 1,
    wherein the regulating step comprises,
        determining a temperature of a speaker based on the impedance,
        comparing the temperature with a preset threshold value, and
        lowering power supply to the speaker where the temperature is above the preset threshold value.

3. The method of claim 1,
    wherein the measuring step comprises,
        detecting current of and voltage over the speaker while the lower frequency signal is provided to the speaker, and
        low pass filtering the detected current and voltage to measure the current of and voltage over the speaker based on the lower frequency signal.

4. The method of claim 1,
    wherein the lower frequency signal comprises a signal with a frequency lower than 30 Hz.

5. A speaker power regulating system comprising,
    an application processor coupled to a speaker;
    a power supply coupled to the speaker;
    a current sensor coupled to the speaker;
    a voltage sensor coupled to the speaker; and
    a speaker impedance measuring module coupled to the current sensor and the voltage sensor,
    wherein the application processor is configured to output an impedance measuring signal to the speaker;
    the current sensor is configured to sense current of the speaker while the impedance measuring signal is output to the speaker;
    the voltage sensor is configured to sense voltage of the speaker while the impedance measuring signal is output to the speaker;
    the speaker impedance measuring module is configured to determine a value indicative of an impedance of the speaker based on a current sensed by the current sensor and a voltage sensed by the voltage sensor; and
    the application processor is configured to regulate a power output of the power supply based on the value determined by the speaker impedance measuring module.

6. The system of claim 5,
    wherein the impedance measuring signal has a frequency less than a frequency of an audio signal.

7. The system of claim 5,
    wherein the impedance measuring signal has a frequency less than 30 Hz.

8. The system of claim 5,
    wherein the impedance measuring signal comprises an analog signal.

9. The system of claim 5,
    wherein the speaker impedance measuring module comprising,
        a low pass filer coupled to the current sensor and the voltage sensor; and
        a comparator coupled to the low pass filter, and
    wherein the low pass filter is configured to pass an output of the current sensor based on the impedance measuring signal to the comparator and pass an output of the voltage sensor based on the impedance measuring signal to the comparator, and
    the comparator is configured to determine the value indicative of the impedance of the speaker based on an output of the low pass filter and output the measured impedance to the processor.

10. The system of claim 9,
wherein the comparator is configured to output the determined value indicative of impedance to the processor.

11. The system of claim 5,
wherein the application processor is configured to determine a temperature of the speaker based on the impedance of the speaker, compare the temperature with a threshold value, and lower the power output of the power supply where the temperature exceeds the threshold value.

12. The system of claim 5, wherein the speaker impedance measuring module includes a subtractor configured to subtract a signal derived from the current sensor from a signal derived from the voltage sensor to thereby produce a subtraction signal.

13. The system of claim 12, wherein the subtractor is coupled to the application processor and is configured to provide the subtraction signal to the application processor.

14. The system of claim 12,
wherein the application processor further comprises,
a digital signal processor configured to generate the impedance measuring signal and a signal to regulate the power output of the power supply;
a digital-to-analog converter (DAC) coupled to the digital signal processor; and
an analog-to-digital converter (ADC) coupled to the digital signal processor,
wherein the DAC is configured to convert the impedance measuring signal to an analog signal and output to the speaker and convert the signal to regulate the power supply to an analog signal and output to the power supply, and
the ADC is configured to convert the value indicative of impedance to a digital signal and output to the digital signal processor.

15. An integrated circuit, comprising:
a power supply configured to be coupled to a speaker;
a current sensor configured to be coupled to the speaker;
a voltage sensor configured to be coupled to the speaker; and
a speaker impedance measuring module coupled to the current sensor and the voltage sensor,
wherein:
the current sensor is configured to sense current of the speaker while an impedance measuring signal output to the speaker;
the voltage sensor is configured to sense voltage of the speaker while the impedance measuring signal is output to the speaker;
the speaker impedance measuring module is configured to determine a value indicative of an impedance of the speaker based on a current sensed by the current sensor and a voltage sensed by the voltage sensor;
wherein the speaker impedance measuring module includes a comparator having a first input, a second input, and an output, wherein the first input is coupled to the current sensor and the second input is coupled to the voltage sensor, and wherein the comparator generates a signal on the output of the comparator based on a comparison of the signals on its first and second inputs.

16. An integrated circuit, comprising:
a power supply configured to be coupled to a speaker;
a current sensor configured to be coupled to the speaker;
a voltage sensor configured to be coupled to the speaker; and
a speaker impedance measuring module coupled to the current sensor and the voltage sensor,
wherein:
the current sensor is configured to sense current of the speaker while an impedance measuring signal output to the speaker;
the voltage sensor is configured to sense voltage of the speaker while the impedance measuring signal is output to the speaker;
the speaker impedance measuring module is configured to determine a value indicative of an impedance of the speaker based on a current sensed by the current sensor and a voltage sensed by the voltage sensor;
wherein the speaker impedance measuring module includes a subtractor having a first input, a second input, and an output, wherein the first input is coupled to the current sensor and the second input is coupled to the voltage sensor, and wherein the subtractor generates a signal on the output of a comparator based on a difference between the signals on its first and second inputs.

17. The integrated circuit of claim 16, further including:
a digital signal processor; and
an analog-to-digital converter coupled between the digital signal processor and the subtractor.

18. The integrated circuit of claim 16 further including:
a first low pass filter coupled to the current sensor;
a second low pass filter coupled to the voltage sensor.

19. The integrated circuit of claim 18, wherein each of the first and second low pass filters have a cut-off frequency less than 60 Hz.

20. A speaker system comprising:
a speaker;
an integrated circuit, comprising:
a power supply coupled to a speaker;
a current sensor coupled to the speaker;
a voltage sensor coupled to the speaker; and
a speaker impedance measuring module coupled to the current sensor and the voltage sensor,
wherein:
the current sensor is configured to sense current of the speaker while an impedance measuring signal output to the speaker;
the voltage sensor is configured to sense voltage of the speaker while the impedance measuring signal is output to the speaker;
the speaker impedance measuring module is configured to determine a value indicative of an impedance of the speaker based on a current sensed by the current sensor and a voltage sensed by the voltage sensor;
wherein the speaker impedance measuring module includes a subtractor having a first input, a second input, and an output, wherein the first input is coupled to the current sensor and the second input is coupled to the voltage sensor, and wherein the subtractor generates a signal on the output of a comparator based on a difference between the signals on its first and second inputs.

21. The speaker system of claim 20, further including:
a digital signal processor; and
an analog-to-digital converter coupled between the digital signal processor and the subtractor.

22. The integrated circuit of claim 20 further including:
a first low pass filter coupled to the current sensor;
a second low pass filter coupled to the voltage sensor.

23. The integrated circuit of claim 22, wherein each of the first and second low pass filters have a cut-off frequency less than 60 Hz.

* * * * *